(12) United States Patent
Irwin et al.

(10) Patent No.: US 6,972,470 B2
(45) Date of Patent: Dec. 6, 2005

(54) DUAL METAL SCHOTTKY DIODE

(75) Inventors: Richard B. Irwin, Richardson, TX (US); Tony T. Phan, Flower Mound, TX (US); Hong-Ryong Kim, Plano, TX (US); Ming-Yeh Chuang, McKinney, TX (US); Jennifer S. Dumin, Wylie, TX (US); Patrick J. Jones, Allen, TX (US); Fredric D. Bailey, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/814,673

(22) Filed: Mar. 30, 2004

(65) Prior Publication Data

US 2005/0221571 A1 Oct. 6, 2005

(51) Int. Cl.⁷ .............................................. H01L 27/95
(52) U.S. Cl. ...................... 257/478; 257/473
(58) Field of Search .............. 257/453–456, 257/473, 478

(56) References Cited

U.S. PATENT DOCUMENTS

| | | | |
|---|---|---|---|
| 4,491,860 A | | 1/1985 | Lim |
| 4,595,942 A | * | 6/1986 | Lohstroh ........................ 326/131 |
| 4,672,412 A | * | 6/1987 | Wei et al. ...................... 257/448 |
| 5,059,555 A | * | 10/1991 | Iranmanesh et al. ......... 438/328 |
| 5,710,447 A | * | 1/1998 | Tohyama ........................ 257/230 |
| 2003/0087482 A1 | | 5/2003 | Hwang et al. |

FOREIGN PATENT DOCUMENTS

GB        2 112 566 A        7/1983

OTHER PUBLICATIONS

Takano Hisanaga, et al. "Semiconductor Element and Method for Manufacturing the Same " Patent Abstracts of Japan, Publication No. 2003-197924, Jul. 11, 2003.

* cited by examiner

*Primary Examiner*—Minhloan Tran
*Assistant Examiner*—Thomas L. Dickey
(74) *Attorney, Agent, or Firm*—Rose Alyssa Keagy; W. James Brady, III; Frederick J. Telecky, Jr.

(57) ABSTRACT

An embodiment of the invention is a Schottky diode 22 having a semiconductor substrate 3, a first metal 24, a barrier layer 26, and second metal 28. Another embodiment of the invention is a method of manufacturing a Schottky diode 22 that includes providing a semiconductor substrate 3, forming a barrier layer 26 over the semiconductor substrate 3, forming a first metal layer 23 over the semiconductor substrate 3, annealing the semiconductor substrate 3 to form areas 24 of reacted first metal and areas 23 of un-reacted first metal, and removing selected areas 23 of the un-reacted first metal. The method further includes forming a second metal layer 30 over the semiconductor substrate 3 and annealing the semiconductor substrate 3 to form areas 28 of reacted second metal and areas 30 of un-reacted second metal.

22 Claims, 3 Drawing Sheets

DUAL METAL SCHOTTKY DIODE

BACKGROUND OF THE INVENTION

This invention relates to the structure and method of making a dual metal Schottky diode.

DETAILED DESCRIPTION OF THE INVENTION

Figure 1A:
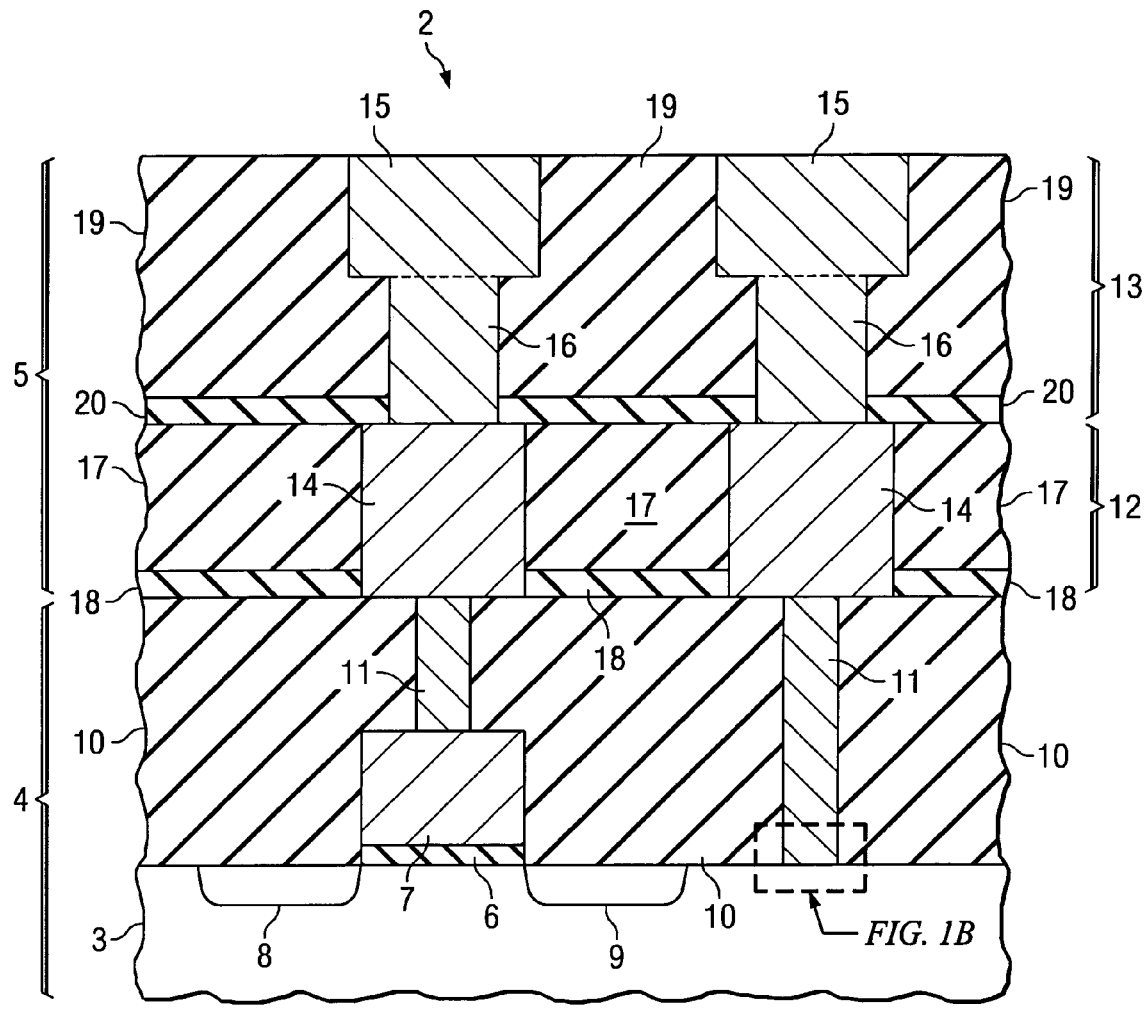
FIGS. 1A–1B are cross-section views of a partial integrated circuit in accordance with a first embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1A is a cross-section view of a partial integrated circuit 2 in accordance with a first embodiment of the present invention. The integrated circuit is divided into two parts based on the fabrication or process flow: the Front-End-Of-Line (FEOL) section 4 and the Back-End-Of-Line (BEOL) section 5. The section that includes the silicon substrate 3 is called the FEOL of the integrated circuit 2. In general, the FEOL section 4 is the transistor layer formed on (and within) the semiconductor substrate 3. The partial FEOL 4 shown in FIGS. 1A and 1B includes a dual metal Schottky diode 22 of the present invention plus a transistor having a gate oxide 6, a gate electrode 7, and source/drain 8, 9; however, it is within the scope of the invention to have any form of logic within the FEOL section 4.

Immediately above the Schottky diode 22 and the transistor is a layer of dielectric insulation 10 containing metal contacts 11 that electrically tie the Schottky diode 22 and the transistor to the other logic elements (not shown) of the FEOL section 4. Preferably, the dielectric insulation 10 is comprised of SiO$_2$ and the contacts 11 are comprised of W. However, the dielectric insulation 10 may be comprised of any suitable material such as SiN, SiC, SiON, or a low-k dielectric. In addition, the contacts may be comprised of any suitable material such as Al, Ti, or Cu.

The BEOL section 5 contains a single damascene metal layer 12 and at least one dual damascene metal layer 13. However, it is within the scope of the invention to have an integrated circuit 2 with only one (single or dual damascene) metal layer. Layers 12 and 13 contain metal lines 14, 15 that properly route electrical signals and power properly throughout the electronic device. Layer 13 also contains vias 16 that properly connect the metal lines of one metal layer (e.g. 14) to the metal lines of another metal layer (e.g. 15). The metal lines 14, 15 may be comprised of any suitable material such as Al. Furthermore, metal lines 14, 15 may be formed by any suitable process such as deposition, plating, or growth. The single damascene metal layer 12 has dielectric material 17 and possibly a dielectric barrier layer 18 that electrically insulates the metal lines 14. Similarly, the dual damascene layer 13 contains dielectric material 19 and possibly a dielectric barrier layer 20 that electrically insulates metal lines 15 and vias 16.

Figure 1B:
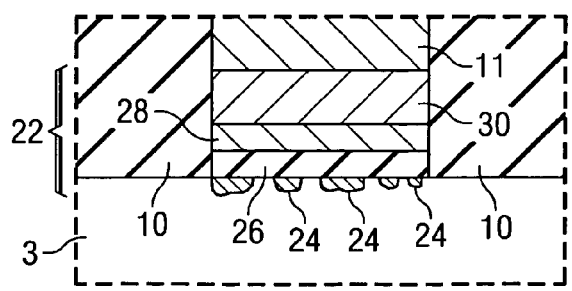

In accordance with the best mode of the present invention, the integrated circuit 2 has a dual metal Schottky diode 22, shown in FIG. 1B. The Schottky diode 22 consists of a lightly doped semiconductor substrate 3, a metal area (or metal islands) 24, a barrier layer 26, a metal area (or metal layer) 28, and a metal area (or metal layer) 30. The semiconductor substrate 3 may be comprised of any suitable material such as Si, GaAs, or InP (or a composite or layers of those elements). In addition, the barrier layer 26 may be a SiO$_2$ or SiN dielectric film. However, other materials such as a deposited SiC or a spin-on-glass ("SOG") could be used for the barrier layer 26. Furthermore, the barrier layer 26 may be removed at during the process of fabricating the Schottky diode 22.

Preferably, the metal islands 24 are comprised of PtSi, the metal layer 28 is comprised of TiSi$_2$ and the metal layer 30 is comprised of Ti. However, it is within the scope of the invention to have metal layers 24 and 28 comprised of any suitable materials such as CoSi$_2$, VSi$_2$, NiSi, NiSi$_2$, ZrSi$_2$, WSi$_2$, TaSi$_2$, MoSi$_2$, or NbSi. Moreover, it is within the scope of the invention to omit barrier layer 26 and/or metal layer 30.

Referring again to the drawings, FIGS. 2–5 show the process for manufacturing the dual metal Schottky diode 22 shown in FIG. 1B. Before the dual metal Schottky diode is fabricated, a layer of photoresist (not shown) is applied and patterned using a lithography process. The openings in this photoresist layer define the locations and size of the dual metal Schottky diodes. In the best mode application, a barrier layer 26 is now formed over the entire substrate. The barrier layer may be formed using any manufacturing process such as Chemical Vapor Deposition ("CVD") or Plasma-Enhanced Chemical Vapor Deposition ("PECVD"). Any standard manufacturing tool, such as the Centura (from AMAT) or Concept (from Novellus), may be used to create the barrier layer 26. In addition, the barrier layer 26 may be formed chemically by reacting the silicon surface with an oxidizer (such as hydrogen peroxide or nitric acid).

In this example application, the barrier layer 26 is comprised of SiO$_2$ and is 20 Å (20 nm) thick. However, it is within the scope of the invention to have any suitable barrier layer thickness appropriate for the composition of the dual metal layers 24, 28, the barrier composition, and the desired voltage drop V$_f$ of the final dual metal Schottky diode.

Figure 2:
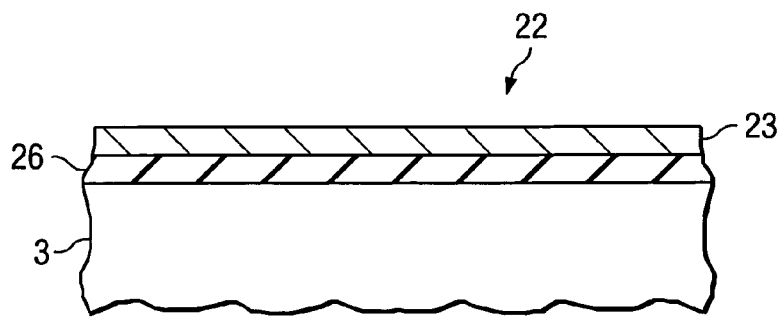
FIGS. 2–5 are cross-sectional diagrams of a process for forming the dual metal Schottky diode shown in FIG. 1B.

Also as shown in FIG. 2, a first metal layer 23 is formed over the barrier layer 26. In the best mode application, the first metal layer 23 contains Pt and is approximately 300 Å thick. However, the thickness of the Pt layer 23 may be anything above 150 Å. In addition, the thickness of the first metal layer 23 may vary depending on the metal composition used. In the example application, the first metal layer is deposited by any well-known manufacturing tool, such as an Endura (from AMAT), a MRC/TEL (from Eclipse), or a Perkin Elmer 4400 series machine.

The semiconductor wafer is now annealed. In the example application, a rapid thermal process ("RTP") is used to heat the wafer to approximately 575° C. for 30–60 seconds in an $O_2$ and a $N_2$ ambient. A Centura RTP by AMAT may be used for this anneal; however other standard process tools and process parameters may be used. For example, a horizontal or vertical furnace may by used to heal the wafer to 500° C. for 20 minutes in an $O_2$ or a $N_2$ ambient. During the anneal process the barrier layer 26 will limit the diffusion of Pt from the first layer metal 23 into the Si substrate 3.

Figure 3:
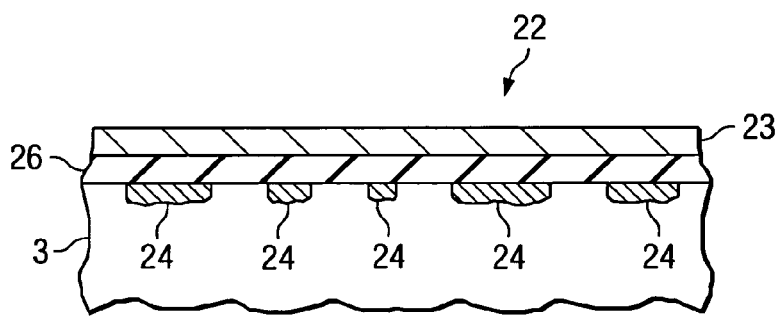

After annealing, islands of PtSi 24 are formed within the semiconductor substrate 3, as shown in FIG. 3. It is to be noted that the temperature for the anneal process is selected so that the first metal layer 23 reacts with the semiconductor substrate 3 but not other materials such as the field oxides or gate oxides.

In the best mode application, the unreacted Pt layer 23 is now removed with an isotropic chemical etch process. More specifically, a standard chemical bench tool is used to etch Pt layer 23 (e.g. in a chemistry of $H_2O$:HCl:HNO for 10 minutes at 75° C.). However, it is within the scope of the invention to use any method to remove the unreacted portions of the unreacted first metal layer 23. In addition, it is within the scope of the invention to perform an additional anneal after the removal of the unreacted Pt layer 23.

Figure 4:
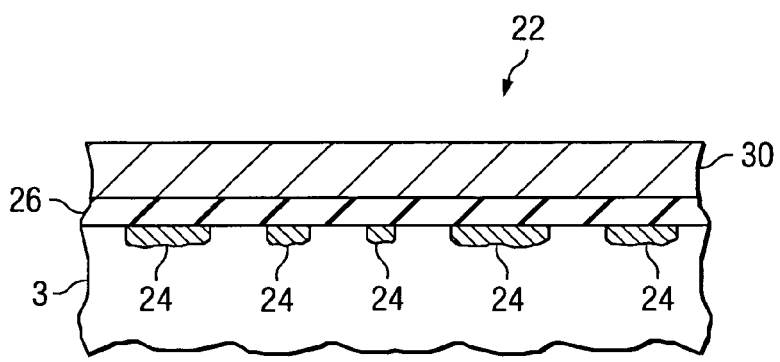

As shown in FIG. 4, a second metal layer 30 is formed over the semiconductor wafer (i.e. over the barrier layer 26 if the barrier layer is not removed, or over the silicon and first metal islands if the barrier layer is removed). In the best mode application, the second metal layer 30 contains Ti and is approximately 400 Å thick. However, the thickness of the Ti layer 30 may range from 300–800 Å. In addition, the thickness of the second metal layer 30 may vary depending on the type of metal used. In the example application, the second metal layer is deposited by any well-known manufacturing tool, such as an Endura (from AMAT), a MRC/TEL (from Eclipse), or a Perkin Elmer 4400 series machine.

The semiconductor wafer is now annealed. In the example application, a rapid thermal process ("RTP") is used to heat the wafer to approximately 625–750° C. for 20–40 seconds in a $N_2$ ambient. A Centura RTP by AMAT may be used for this anneal; however other standard process and tools may be used. For example, a horizontal or vertical furnace may by used to heat the wafer to 600–675° C. for 30–60 minutes in a $N_2$ ambient.

Figure 5:
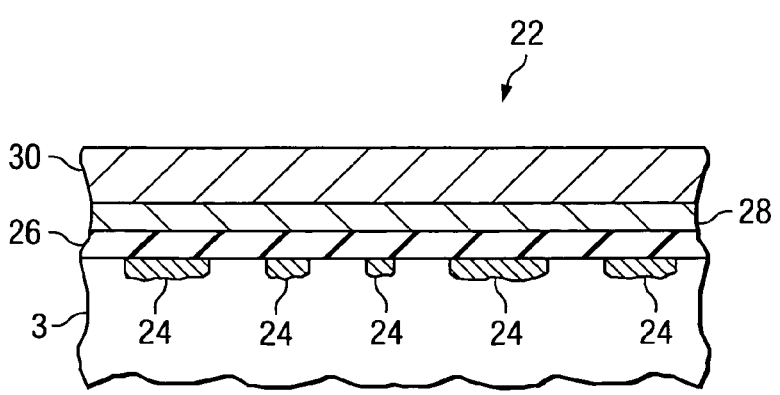

After annealing, the Si from the semiconductor substrate 3 diffuses into the second metal layer 30 and forms a layer 28 of $TiSi_2$ 24, as shown in FIG. 5. It is to be noted that the temperature for the anneal process is selected so that the second metal layer 30 reacts with the semiconductor substrate 3 but not other materials such as the field oxides or gate oxides.

In the example application, a step of etching the unreacted second metal layer 30 (or selected portions of that layer) is optional. If the second metal layer 30 is not removed than it may be used as an electrical contact for the dual metal Schottky diode 22. If the second metal layer 30 is removed, any well-known etch process may be used. For example, sulfuric based (piranha) chemistry or a chemistry of $H_2O$/$H_2O_2$ (5:1 ratio) at 40–60° C. for 30–60 minutes may be used to strip the unreacted Ti (or the selected portions of Ti). In the example application, a second anneal is now performed; however, this additional anneal is optional. Any standard process may be used for the second anneal. For example, a Centura RTP could be used at 820–910° C. for 10–30 seconds in a $N_2$ ambient, or a furnace could be used to heat the wafer to 750–850° C. in a $N_2$ ambient for 30–60 minutes.

At this point, the fabrication of the semiconductor wafer continues until the integrated circuit is complete. That fabrication process would include the formation of contacts 11 shown in FIGS. 1A and 1B that electrically connect the dual metal Schottky diode 22 to the proper components of the integrated circuit 2.

It is within the scope of the invention to use any suitable metal for the first metal area 24 and the second metal area 28 of the dual metal Schottky diode 22. As stated above, the metal components 24, 28 of the dual metal Schottky diode may be any suitable metal composition such as PtSi, $TiSi_2$, $CoSi_2$, $VSi_2$, NiSi, $ZrSi_2$, $WSi_2$, $TaSi_2$, $MoSi_2$, or NbSi.

Figure 6:
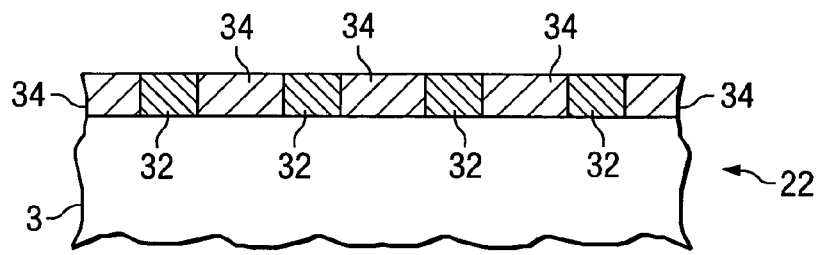
FIGS. 6–7 are cross-sectional diagrams of a process for forming a dual metal Schottky diode in accordance with a second embodiment of the present invention.
Figure 7:
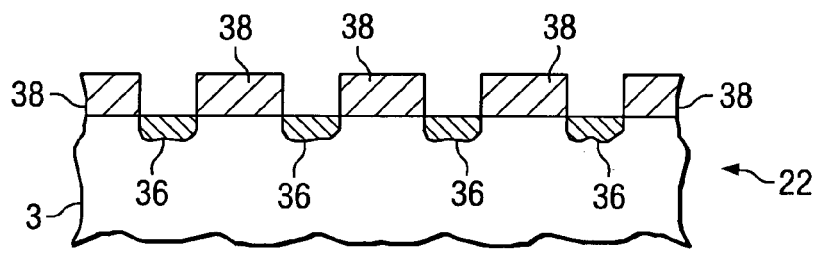

It is also within the scope of the invention to use one or more masks to create a dual metal Schottky diode 22 in any one of many configurations. An example variation of the dual metal Schottky diode 22 is shown in FIGS. 6–7. A first mask is used to form the areas (i.e. a first amount) of a Pt first metal 32 and a second mask is used to form the areas (i.e. a first amount) of a Ti second metal 34 shown in FIG. 6. After the anneal and subsequent etch of the unreacted metal 32 and 34, the final dual metal Schottky diode structure 22 would contain areas of PtSi 36 and areas of $TiSi_2$ 38, as shown in FIG. 7.

Figure 8:
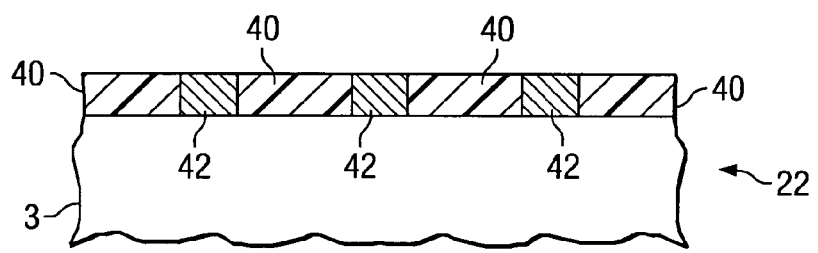
FIGS. 8–10 are cross-sectional diagrams of a process for forming a dual metal Schottky diode in accordance with a third embodiment of the present invention.
Figure 9:
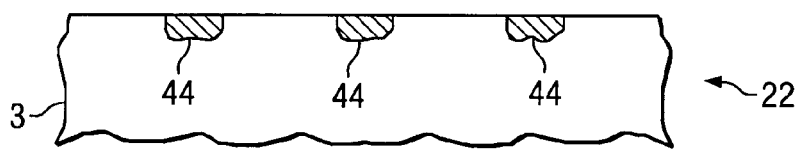
Figure 10:
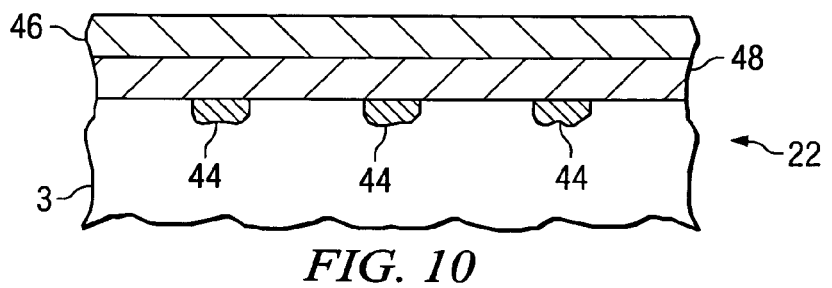

Alternatively, a lithography process could be used to create a patterned photoresist mask layer 40 that is then used to create sections of a Pt first metal 42, as shown in FIG. 8. After removing the exposed metal and ashing the semiconductor wafer to remove the photoresist layer 40, the semiconductor wafer is annealed to form areas of reacted PtSi 44, as shown in FIG. 9. In this alternative embodiment, a Ti second metal layer 46 is deposited and the wafer is then annealed to form a layer of reacted $TiSi_2$ 48, as shown in FIG. 10.

When one or more masks are used to fabricate the Schottky diode in accordance with this invention, it is within the scope of the invention to use a dual metal Schottky diode with the barrier layer 26 removed. If such a diode is desired then the dual metal Schottky diode is fabricated without a barrier layer 26, or the barrier layer 26 is eliminated with the removal of the first unreacted metal or after the removal of the first unreacted metal.

Moreover, it is within the scope of the invention to use photoresist masks to create different dual metal Schottky diodes 22 throughout the integrated circuit 2. For example, patterned photoresist layers could be used throughout the fabrication process to form the dual metal Schottky diode 22 of FIG. 5 and the dual metal Schottky diode 22 of FIG. 10 at different locations within the same integrated circuit 2.

It is to be noted that a variety of structures and metals can be used to create a dual metal Schottky diode having a $V_f$ that is anywhere between the $V_f$ of a Schottky diode containing the first metal and the $V_f$ of a Schottky diode containing the second metal. Specifically, by using a barrier layer to limit the interaction of the first metal with the substrate, or by using a mask to apportion the area of the diode between the first and second metals, a Schottky diode can be fabricated to have any desired $V_f$ between the $V_f$ levels obtained with Schottky diodes comprised of single metals. The use of one or more photoresist masks during wafer fabrication also facilitates the incorporation of dual metal Schottky diodes having different voltage drops at different locations throughout the integrated circuit 2.

Various modifications to the invention as described above are within the scope of the claimed invention. As an example, instead of placing the dual metal Schottky diode 22 immediately above the semiconductor substrate 3 as described above, the dual metal Schottky diode 22 may be placed in any location (or various locations simultaneously) within the front end section 4 or back end section 5 of the integrated circuit. Also, the present invention may be used in any integrated circuit configuration, including integrated circuits having different semiconductor substrates, metal layers, barrier layers, dielectric layers, device structures, active elements, passive elements, etc. In addition, barrier layer 26 may be a metal barrier film (TiSiN, TiN, TaN) instead of a dielectric barrier film. Furthermore, the invention can be used on a non-semiconductor substrate by using a deposited silicide formed by Chemical Vapor Deposition (using WSi), Physical Vapor Deposition (using a composite target), or by reactive sputtering. Moreover, the invention is applicable to other semiconductor technologies such as BiCMOS, bipolar, SOI, strained silicon, pyroelectric sensors, opto-electronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A Schottky diode comprising:
a semiconductor substrate;
a first metal area coupled to said semiconductor substrate;
a barrier layer coupled to said first metal area; and
a second metal area coupled to said barrier layer;
wherein said first metal area includes islands comprised of said first metal.

2. The Schottky diode of claim 1 wherein said first metal area includes PtSi.

3. The Schottky diode of claim 1 wherein said barrier layer includes $SiO_2$.

4. The Schottky diode of claim 1 wherein said barrier layer includes SiN.

5. The Schottky diode of claim 1 wherein said second metal area includes $TiSi_2$.

6. The Schottky diode of claim 1 wherein said semiconductor substrate includes Si.

7. A Schottky diode comprising:
a semiconductor substrate;
a first metal area coupled to said semiconductor substrate; and
a second metal area coupled to said first metal;
wherein said first metal area includes islands comprised of said first metal.

8. The Schottky diode of claim 7 wherein said first metal area includes PtSi.

9. The Schottky diode of claim 7 wherein said second metal area Includes $TiSi_2$.

10. The Schottky diode of claim 7 wherein said semiconductor substrate includes Si.

11. An integrated circuit comprising:
a semiconductor substrate;
a first Schottky diode coupled to said semiconductor substrate, said first Schottky diode having a first amount of a first metal coupled to said semiconductor substrate, a first barrier layer coupled to said first amount of a first metal, and a second amount of a second metal coupled to said first barrier layer; and
a second Schottky diode coupled to said semiconductor substrate, said second Schottky diode having a third amount of said first metal coupled to said semiconductor substrate, a second barrier layer coupled to said third amount of said first metal, and a fourth amount of said second metal coupled to said second barrier layer;
wherein said first amount is at least 0.1% more than said third amount and said second amount is at least 0.1% more than said fourth amount.

12. The integrated circuit of claim 11 wherein said first metal includes PtSi.

13. The integrated circuit of claim 11 wherein said barrier layer includes $SiO_2$.

14. The integrated circuit of claim 11 wherein said barrier layer includes SiN.

15. The integrated circuit of claim 11 wherein said second metal includes $TiSi_2$.

16. The integrated circuit of claim 11 wherein said semiconductor substrate includes Si.

17. An integrated circuit comprising:
a semiconductor substrate;
a first Schottky diode coupled to said semiconductor substrate, said first Schottky diode having a first amount of a first metal coupled to said semiconductor substrate and a second amount of a second metal coupled to said semiconductor substrate and also to said first amount of a first metal; and
a second Schottky diode coupled to said semiconductor substrate, said second Schottky diode having a third amount of said first metal coupled to said semiconductor substrate and a fourth amount of said second metal coupled to said semiconductor substrate and also to said third amount of said first metal;
wherein said first amount is at least 0.1% more than said third amount and said second amount is at least 0.1% more than said fourth amount.

18. The integrated circuit of claim 17 wherein said first metal includes PtSi.

19. The integrated circuit of claim 17 wherein said second metal includes $TiSi_2$.

20. The integrated circuit of claim 17 wherein said semiconductor substrate includes Si.

21. A integrated circuit, including a first dual metal Schottky diode having a voltage drop more than 0.1% different than a voltage drop of a second dual metal Schottky diode, manufactured in accordance with a method comprising:
providing a semiconductor substrate; and
forming at least a first Schottky diode and a second Schottky diode, said method of forming said first Schottky diode and said second Schottky diode comprising the following steps in the sequence set forth:
forming a barrier layer over said semiconductor substrate;
forming a first patterned photoresist layer over said semiconductor substrate, said first patterned photoresist layer exposing different portions of a first Schottky diode and a second Schottky diode locations;

forming a first metal layer over said semiconductor substrate;

removing said first patterned photoresist layer;

annealing said semiconductor substrate to form areas of reacted first metal and areas of un-reacted first metal;

removing selected areas of said un-reacted first metal;

forming a second patterned photoresist layer over said semiconductor substrate, said second patterned photoresist layer exposing different portions of said first Schottky diode and said second Schottky diode locations;

forming a second metal layer over said semiconductor substrate;

removing said second patterned photoresist layer; and annealing said semiconductor substrate to form areas of reacted second metal and areas of un-reacted second metal.

22. A integrated circuit, including a first dual metal Schottky diode having a voltage drop more than 0.1% different than a voltage drop of a second dual metal Schottky diode; wherein said first dual metal Schottky diode is comprised of a first metal and a second metal, and said second dual metal Schottky diode is comprised of said first metal and said second metal.

* * * * *